(12) United States Patent
Nagai et al.

(10) Patent No.: US 6,402,834 B1
(45) Date of Patent: Jun. 11, 2002

(54) APPARATUS AND METHOD FOR MANUFACTURING MONOCRYSTALS

(75) Inventors: Kunihiko Nagai, Samukawa-machi; Kohei Kodaira, 4-1, Sanjyo 9-chome, Ainosato, Kita-ku, Sapporo-shi, Hokkaido 002-8073; Hiroyuki Tanaka; Hideki Sakamoto, both of Samukawa-machi, all of (JP)

(73) Assignees: Toyo Communication Equipment Co., Ltd., Kanagawa; Kohei Kodaira, Hokkaido, both of (JP)

( * ) Notice: Subject to any disclaimer, the term of this patent is extended or adjusted under 35 U.S.C. 154(b) by 0 days.

(21) Appl. No.: 09/485,049

(22) PCT Filed: May 28, 1999

(86) PCT No.: PCT/JP99/02848

§ 371 (c)(1),
(2), (4) Date: Jan. 31, 2000

(87) PCT Pub. No.: WO99/63132

PCT Pub. Date: Dec. 9, 1999

(30) Foreign Application Priority Data

May 29, 1998 (JP) .......................................... 10-166089

(51) Int. Cl.[7] .............................................. C30B 15/18
(52) U.S. Cl. ............................ 117/13; 117/33; 117/34; 117/910; 117/948
(58) Field of Search ................................ 117/948, 910, 117/13, 33, 34

(56) References Cited

U.S. PATENT DOCUMENTS

| | | | |
|---|---|---|---|
| 4,144,117 A | * | 3/1979 | Fukuda et al. .............. 117/910 |
| 4,495,155 A | * | 1/1985 | Ricard et al. ................ 17/910 |
| 4,710,260 A | * | 12/1987 | Witter et al. .................. 117/33 |
| 5,037,503 A | * | 8/1991 | Kajimoto et al. ............. 117/33 |
| 5,270,020 A | * | 12/1993 | Suzuki et al. ................. 117/33 |
| 5,919,304 A | * | 7/1999 | Imaeda et al. ............... 117/948 |
| 6,027,563 A | * | 2/2000 | Choudhary et al. .......... 117/33 |

FOREIGN PATENT DOCUMENTS

| | | | |
|---|---|---|---|
| JP | 4-300281 | * 10/1992 | ................. 117/948 |
| JP | H5-310500 A | 11/1993 | |
| JP | H6-191996 A | 7/1994 | |

OTHER PUBLICATIONS

Takao Kitagawa et al. "Growth of $Li_2B_4O_7$ Single Crystals by a Pulling–Down Method" published in Journal of the Ceramic Society of Japan Jul., 1997 pp. 616–619 Japan.

Shinji Kan et al. "$LiNbO_3$ single crystal growth by the continuous charging Czochralski Method with Li/Nb ratio control published in Journal of Crystal Growth" May, 1992 pp. 215–200 Netherlands.

* cited by examiner

*Primary Examiner*—Robert Kunemund
(74) *Attorney, Agent, or Firm*—Koda & Androlia

(57) ABSTRACT

In a monocrystal producing device using a pulling-down method, a raw material melt 5m is continuously supplied into a crucible 2 to grow a crystal 18 by supplying a powdery raw material 5p onto a premelt plate 3 inside an electric furnace 10 with a powdery raw material supplying device 20 and melting the powdery raw material 5p on the premelt plate 3 to generate the raw material melt 5m, and causing this raw material melt 5m to drop out inside the crucible 2. A dry air is introduced into the powdery raw material 5p inside the powdery raw material tank 6 to prevent moisture of the raw material powder 5p. A transferring tube 9 for transferring the raw material 5m is cooled to prevent the filling in the transferring tube 9 based on melting of the powdery raw material 5p. This makes it possible to produce a monocrystal having a stable chemical composition, a large diameter, and a long size at a low price.

4 Claims, 6 Drawing Sheets

APPARATUS AND METHOD FOR MANUFACTURING MONOCRYSTALS

TECHNICAL FIELD

The present invention relates to a monocrystal producing technique, and in particular to a producing device and a producing process for producing a monocrystal by a pulling-down method, and a monocrystal.

BACKGROUND ART

In recent years, monocrystals of oxides such as lithium tantalate $LiTaO_3$ (referred to as LT hereinafter), lithium niobate $LiNbO_3$ (referred to as LN hereinafter), lithium tetraborate $Li_2B_4O_7$ (referred to as LBO hereinafter), and langasite $La_3Ga_5SiO_{14}$ (referred to as LGS hereinafter) have been used to produce various surface acoustic wave devices. These monocrystals are piezoelectric crystals having a large electromechanical coupling coefficient than that of a quartz crystal substrate. LBO and LGS have a cut angle of a zero temperature coefficient. Therefore, if these monocrystals are used for a surface acoustic wave device, terminals such as a portable telephone become small-sized and come to have high functions. In crystals of LT and LN, the ratio of Li to Ta or the ratio of Li to Nb stoichiometrically becomes 1:1. Crystals having such a composition are suitable for optical materials since they have in their lattices no defect or gap to become an ideal crystal structure and they have a constant refractive index in the crystals thereof to generate no diffuse reflection.

The methods for growing the above-mentioned monocrystals are roughly classified into the following three methods. That is, the methods are the Czochralski method (CZ method), the vertical Bridgman method (VB method) and a pulling-down method.

As shown in FIG. 6, the Czochralski method (CZ method, rotation pulling method) is the method of putting a raw material to be crystallized into a platinum crucible 41, heating the raw material to the melting point thereof or higher in an electric furnace 42 to be melted, immersing the lower end of a seed crystal 44 in a rod form into the resultant 43, and pulling the crystal with slow rotation so as to grow a crystal 45 from the lower end of the seed crystal 44.

As shown in FIG. 7, the vertical Bridgman method is the method of putting a raw material to be crystallized into a platinum crucible 51, heating the raw material to the melting point thereof or higher in an electric furnace 52 to be melted, putting a plate-form seed crystal 53 into the platinum crucible 51 from one end thereof, and slowly moving the platinum crucible 51, with keeping the side of the seed crystal 53 ahead, from the side of high temperature to the side of low temperature in the state that temperature gradient is generated inside the electric furnace 52, so as to grow a crystal successively from the side of the seed crystal 53.

The pulling-down method is a monocrystal growing method published in a document (Journal of the Ceramic Society of Japan 105[7] 1997) by one of the inventors of the present application. As shown in FIG. 8, this method is the method of putting a polycrystal raw material into a platinum crucible 61 having a fine hole 610a in its bottom, arranging this platinum crucible 61 at the position where temperature gradient is steepest inside an electrical furnace 62 whose upper side is kept over the melting point of the raw material and whose lower side is kept below the melting point thereof to melt the raw material, and pulling down a seed crystal 63 with rotation in the state that the upper end of the seed crystal 63 in a rod form is brought into contact with the raw material melt that has flown out from the fine hole 61a of the platinum crucible 61 by gravity. According to this pulling-down method, the raw material melt is kept between the platinum crucible 61 and the seed crystal 63, using both of wettability of the raw material melt to the crucible 61, this melt being a melt that has leaked out from the fine hole 61a of the bottom of the platinum crucible 61, and surface tensile thereof, so as to grow a crystal.

In general, monocrystals such as LN, LT and LGS are grown by the rotation pulling method (CZ method), and LBO is mainly grown by the vertical Bridgman method (VB method). LBO can be however grown by the CZ method.

However, conventional monocrystal growing methods, which are represented by the CZ method, have the following problems.

In connection with the melting points of raw materials, it is general that a platinum crucible is necessary for the growth of LN and an iridium crucible is necessary for the growth of LT and LGS. In connection with crystal size, a crucible of about 4 kg and a crucible of about 5 kg are necessary for the growth of, e.g., a crystal of 3 inches in diameter and a crystal of 4 inches in diameter, respectively. If an after-heater is used to keep growing temperature constant, a noble metal, such as platinum and iridium, of 1–2 kg becomes necessary. Since such a noble metal is used in a large amount, a large burden is imposed from the viewpoint of costs.

The conventional methods are in a so-called batch manner, in which it is necessary that not only a monocrystal to be pulled from a crucible and grown but also a considerably excess monocrystal are melted in the crucible and the total amount thereof is kept over the melting point. Therefore, there are limitations in enlarging the diameter of a pulled crystal and making the crystal long. Furthermore, electric power consumed with the heater and the like increases largely as the crystal becomes larger.

Crystals such as LN and LT have a wide solid solution area. Since their chemical composition is different from its congruent melt composition, their composition easily changes between the initial and final periods of the growing of the crystals. If, for example, temperature and the molar ratio (%) of lithium oxide ($LiO_2$) are expressed by a vertical axis and a horizontal axis, respectively, the state diagram (phase diagram) of LT is as shown in FIG. 9. When the monocrystal having varied compositions are used to make SAW devices, their propagation speeds and piezoelectric constants are scattered, so as to result in a drop in the yield of products.

In the CZ method, reacting treatments and high temperature treatments such as mixing of raw materials of tantalum pentaoxide $Ta_2O_5$ and lithium carbonate $Li_2CO_3$, sintering, pulverizing and press are conducted as a treatment before a raw material is charged into a crucible. Therefore, the composition changes in the step of preparing the raw material by evaporation of lithium oxide $Li_2O$ or the like, which has a high vapor pressure. Besides, the composition of the resultant crystal changes by evaporation of a specific substance in the crystal growing step.

In the CZ method, a monocrystal rod is grown by the steps of sowing seeds, producing a shoulder portion, and then growing a body portion. However, it takes a long time to grow the body portion. Moreover, in order to obtain the body portions having a little dispersion of their diameters, a high-priced ADC (Automatic Diameter Control) device is necessary, so that costs for the production thereof become high.

As can also be. understood in FIG. 9, crystals such as LN and LT are crystallized into their congruent melt composition at T1, which is the highest temperature in the case that the liquid phase is changed into the solid phase. When the melt of Li and Nb is put into a crucible and a seed crystal is pulled upon the growth of a crystal by the CZ method, the initial growth of the crystal (the crystal containing Nb whose amount is larger than that of Li) advances in the state of its congruent composition, which causes easy crystallization. However, Li and Nb are beforehand mixed at a ratio of 1 to 1 in the crucible, so that the amount of Nb becomes smaller than that of Li in the melt as the growth of the crystal advances. As a result, a crystal having a content of Li larger than the Li content in the congruent composition is grown when crystallization advances slowly. That is, regions having different compositions are generated in a monocrystal.

Accordingly, in the CZ method a melt is beforehand made up so as to have a congruent composition, and the CZ method is generally used to grow a congruent crystal. In this case, however, the melt does not always have a uniform composition. Thus, the composition is easily scattered. This is also the same in the Bridgman method. So far as all of necessary materials need to be beforehand put into a crucible, the scattering cannot be avoided. Therefore, it is difficult to grow crystals having compositions other than the congruent composition, that is, incongruent compositions (including a stoichiometrical composition).

The congruent compositions of LN and LT are as follows:

$$Li/(Li+Nb) \times 100 \approx 48\%,$$

and $$Li/(Li+Ta) \times 100 \approx 48\%.$$

Therefore, in order to obtain a crystal having an incongruent composition (the component ratio of Li is from 48.5 to 50.0% in the case of, e.g., LN or LT), it has been inevitable up to the present to use other methods. For example, a monocrystal growing method of "the double crucible method" is known. As is well known, however, the diameter of a crystal that can be grown is small and the limitation thereof is about 1 inch. In the fields in which LN and LT are used as piezoelectric materials or optical materials of a SAW device or the like, a larger monocrystal has been desired from the viewpoint of productivity. It has been desired to develop a crystal growing method making it possible to grow a large monocrystal having a stable composition and a diameter of more than 1 inch at a low price.

The vertical Bridgman method is a standard method for growing an LBO monocrystal at present. It is necessary to prepare a platinum crucible newly whenever an LBO crystal is grown at a time. Thus, a problem arises that costs for production thereof become high.

In the light of the above-mentioned situations, the present invention has been made. A problem that should be solved is to provide a monocrystal producing device and a monocrystal producing process that make it possible to produce a monocrystal having a stable composition and having a large diameter and a long size at a low price, and provide an LN monocrystal, an LT monocrystal or the like that has a diameter of more than 1 inch and a stable composition.

DISCLOSURE OF THE INVENTION

The monocrystal producing device of the invention recited in claim 1 is a monocrystal producing device for growing a crystal by arranging a crucible for melting a raw material in an electric furnace, keeping the crucible at a temperature not less than the melting point of the raw material, and pulling down and simultaneously rotating a seed crystal in the state that the upper end portion of the seed crystal is brought into contact with a raw material melt that has leaked out from a fine hole made at the bottom portion of the crucible, characterized by comprising a powdery raw material supplying means for introducing a powdery raw material into the crucible from the above, and a premelt plate for receiving the powdery raw material from this powdery raw material supplying means to be melted and subsequently introducing the melt into a melt-collecting portion of the crucible.

According to the monocrystal producing device made as above, the powdery raw material is supplied onto the premelt plate with the powdery raw material supplying means and then the powdery raw material is melted on the premelt plate to generate the raw material melt and introduce the raw material melt into the melt-collecting portion of the crucible to keep the outflow amount of the raw material melt from the fine hole of the bottom of the crucible substantially constant. In this way, a crystal can be grown while the raw material melt is continuously supplied into the crucible. It is therefore possible to obtain easily a monocrystal having a large diameter and a long size. The process for growing the crystal from the powdery raw material can be continuously performed so that the composition of the obtained monocrystal becomes stable. High-priced constituting elements such as the platinum crucible can be used semipermanently after only initial investment. Thus, producing costs can be made low.

The monocrystal producing device of the invention recited in claim 2 is characterized in that the powdery raw material supplying means in claim 1 comprises a powdery raw material tank for receiving the powdery raw material, a dry air introducing means for introducing a dry air into the powdery raw material inside this powdery raw material tank, and a raw material transferring means for transferring the powdery raw material from this powdery raw material tank onto the premelt plate.

According to the monocrystal producing device made as above, by introducing the dry air into the powdery raw material to remove the moisture of the raw material powder, it is possible to prevent condensation of the raw material powder based on the moisture and supply stably the powdery raw material having a constant ratio of the components onto the premelt plate.

The monocrystal producing device of the invention recited in claim 3 is characterized in that the premelt plate in claim 2 is, together with the crucible, arranged inside the electric furnace, and the raw material transferring means comprises a transferring tube whose one end is connected to the powdery raw material tank and whose other end is inserted into the electric furnace to transfer the powdery raw material onto the premelt plate, and a cooling means for cooling this transferring tube from the outside.

According to the monocrystal producing device made as above, the structure of the device can be made simple since the crucible and the premelt plate can be heated with the single electric furnace. Moreover, by cooling the transferring tube for transferring the powdery raw material from the outside of the electric furnace onto the premelt plate inside the electric furnace, it is possible to prevent the melting of the powdery raw material in the middle of the transferring tube and the filling in the transferring tube.

The monocrystal producing device of the invention recited in claim 4 is a monocrystal producing device for growing a crystal by arranging a crucible for melting a raw material in an electric furnace, keeping the crucible at a temperature not less than the melting point of the raw material, and pulling down and simultaneously rotating a seed crystal in the state that the upper end portion of the seed crystal is brought into contact with a raw material melt that has leaked out from a fine hole made at the bottom portion of the crucible, characterized by comprising a raw material melting tank for melting a powdery raw material (a raw material in a powdery state) to generate the raw material melt, a powdery raw material supplying means for introducing the powdery raw material into this raw material melting tank, and a raw material melt introducing means for introducing the raw material melt inside the raw material melting tank into the crucible.

According to the monocrystal producing device made as above, the powdery raw material is supplied to the raw material melting tank with the powdery raw material supplying means and the raw material is melted in the raw material melting tank to generate the raw material melt. This raw material melt is introduced into the crucible with the raw material melt introducing means. In this way, the crystal can be grown while the raw material melt is supplied into the crucible. Therefore, the crystal can be grown while the amount of the melt in the crucible from the start of the crystal growth to the end thereof is kept substantially constant to keep the outflow amount of the raw material melt from the fine hole of the bottom portion for the crucible.

The monocrystal producing device of the invention is characterized in that the powdery raw material supplying means in claim 4 comprises a powdery raw material tank for receiving the powdery raw material, a dry air introducing means for introducing a dry air into the powdery raw material inside this powdery raw material tank, and a raw material transferring means for transferring the powdery raw material from this powdery raw material tank into the raw material melting tank.

According to the monocrystal producing device made as above, by introducing the dry air into the powdery raw material to remove the moisture of the raw material powder, it is possible to prevent condensation of the raw material based on the moisture and supply the powdery raw material having a constant composition ratio stably.

The monocrystal producing device of the invention is characterized in that the raw material melting tank is, together with the crucible, arranged inside the electric furnace, and the raw material transferring means comprises a transferring tube whose one end is connected to the powdery raw material tank and whose other end is inserted into the electric furnace to transfer the powdery raw material onto the raw material melting tank, and a cooling means for cooling this transferring tube from the outside.

According to the monocrystal producing device made as above, the structure of the device can be made simple since the crucible and the raw material melting tank can be heated with the single electric furnace. Moreover, by cooling the transferring tube for transferring the powdery raw material from the outside of the electric furnace into the raw material melting tank inside the electric furnace, it is possible to prevent the melting of the powdery raw material in the middle of the transferring tube and the filling in the transferring tube.

The monocrystal producing device of the invention is characterized in that the raw material melting tank is arranged above the crucible, and the raw material melt introducing means comprises a guide member for transferring, along its surface, the raw material melt that has leaked out and flown down from the fine hole made at the bottom portion of the raw material melting tank to guide the melt into the crucible.

According to the monocrystal producing device made as above, the raw material melt that has leaked out from the bottom portion of the raw material melting tank is transferred along the surface of the guide member, and is descended by the weight of itself, so as to be supplied into the crucible. Water or impurities remaining in the raw material melt are, before being put into the crucible, evaporated and removed by the heat from the electric furnace.

The monocrystal producing device of the invention is a monocrystal producing process for growing a crystal by arranging a crucible for melting a raw material in an electric furnace, keeping the crucible at a temperature not less than the melting point of the raw material, and pulling down and simultaneously rotating a seed crystal in the state that the upper end portion of the seed crystal is brought into contact with a raw material melt that has leaked out from a fine hole made at the bottom portion of the crucible, characterized by performing the crystal growth while supplying the raw material melt continuously into the crucible to keep the outflow amount of the raw material melt from the fine hole of the bottom portion of the crucible substantially constant by arranging a premelt inside or above the crucible inside the electric furnace, supplying continuously the powdery raw material in an appropriate amount at each time from the powdery raw material tank out of the electric furnace onto the premelt plate through a transferring tube so as to melt the powdery raw material on the premelt plate, and introducing the melt into a melt-collecting portion of the crucible.

According to the above-mentioned process, a monocrystal having a large diameter and a long size can easily be obtained. Moreover, the obtained crystal can have a stable composition since the process for growing the crystal from the powdery raw material is continuously performed.

The monocrystal producing process of the invention is a monocrystal producing process for growing a crystal by arranging a crucible for melting a raw material in an electric furnace, keeping the crucible at a temperature not less than the melting point of the raw material, and pulling down and simultaneously rotating a seed crystal in the state that the upper end portion of the seed crystal is brought into contact with a raw material melt that has leaked out from a fine hole made at the bottom portion of the crucible, characterized by performing the crystal growth while supplying the raw material melt continuously into the crucible to keep the outflow amount of the raw material melt from the hole of the bottom portion of the crucible substantially constant by arranging a raw material melting tank above the crucible inside the electric furnace, supplying the powdery raw material in an appropriate amount at each time from the powdery raw material tank out of the electric furnace onto the raw material melting tank through a transferring tube so as to melt the powdery raw material in the raw material melting tank, and subsequently introducing the melt into a melt-collecting portion of the crucible.

According to the above-mentioned process, a monocrystal having a large diameter and a long size can easily be obtained. Moreover, the obtained crystal can have a stable composition since the process for growing the crystal from the powdery raw material is continuously performed.

The monocrystal producing process of the invention is characterized in that the powdery raw material is a powdery raw material comprising a mixture of lithium (Li) powder and niobium (Nb) powder, and the component ratio of lithium to the total of lithium and niobium in the powdery raw material is from 48.5 to 50.0%.

According to the above-mentioned process, it is possible to produce a lithium niobate ($LiNbO_3$) monocrystal having an incongruent melting composition wherein the component ratio of lithium to the total of lithium and niobium is from 48.5 to 50.0% and its diameter is 1.2 inches or more.

The monocrystal producing process of the invention is characterized in that the powdery raw material used in the process of claim 8 or 9 is a powdery raw material comprising a mixture of lithium (Li) powder and tantalum (Ta) powder, and the component ratio of lithium to the total of lithium and tantalum in the powdery raw material is from 48.5 to 50.0%.

According to the above-mentioned process, it is possible to produce a lithium tantalate ($LiTaO_3$) monocrystal having an incongruent melting composition wherein the component ratio of lithium to the total of lithium and tantalum is from 48.5 to 50.0% and its diameter is 1.2 inches or more.

A monocrystal of the invention characterized in that it is a monocrystal having an incongruent melt composition and its diameter is 1.2 inches or more.

A monocrystal of the invention recited in claim 13 is characterized in that the monocrystal, having an incongruent melt component, is lithium niobate ($LiNbO_3$) and the component ratio of lithium to the total of lithium and niobium contained therein is from 48.5 to 50.0%.

A monocrystal of the invention is characterized in that the monocrystal, having an incongruent melt component, is lithium tantalate ($LiTaO_3$), and the component ratio of lithium to the total of lithium and tantalum contained therein is from 48.5 to 50.0%.

A monocrystal of the invention is characterized in that and the scattering in its Curie point is ±2° C. or less.

A monocrystal of the invention is a wafer characterized by having characteristics and having a diameter of 1.2 inches or more.

BEST MODES FOR CARRYING OUT THE INVENTION

Figure 1:
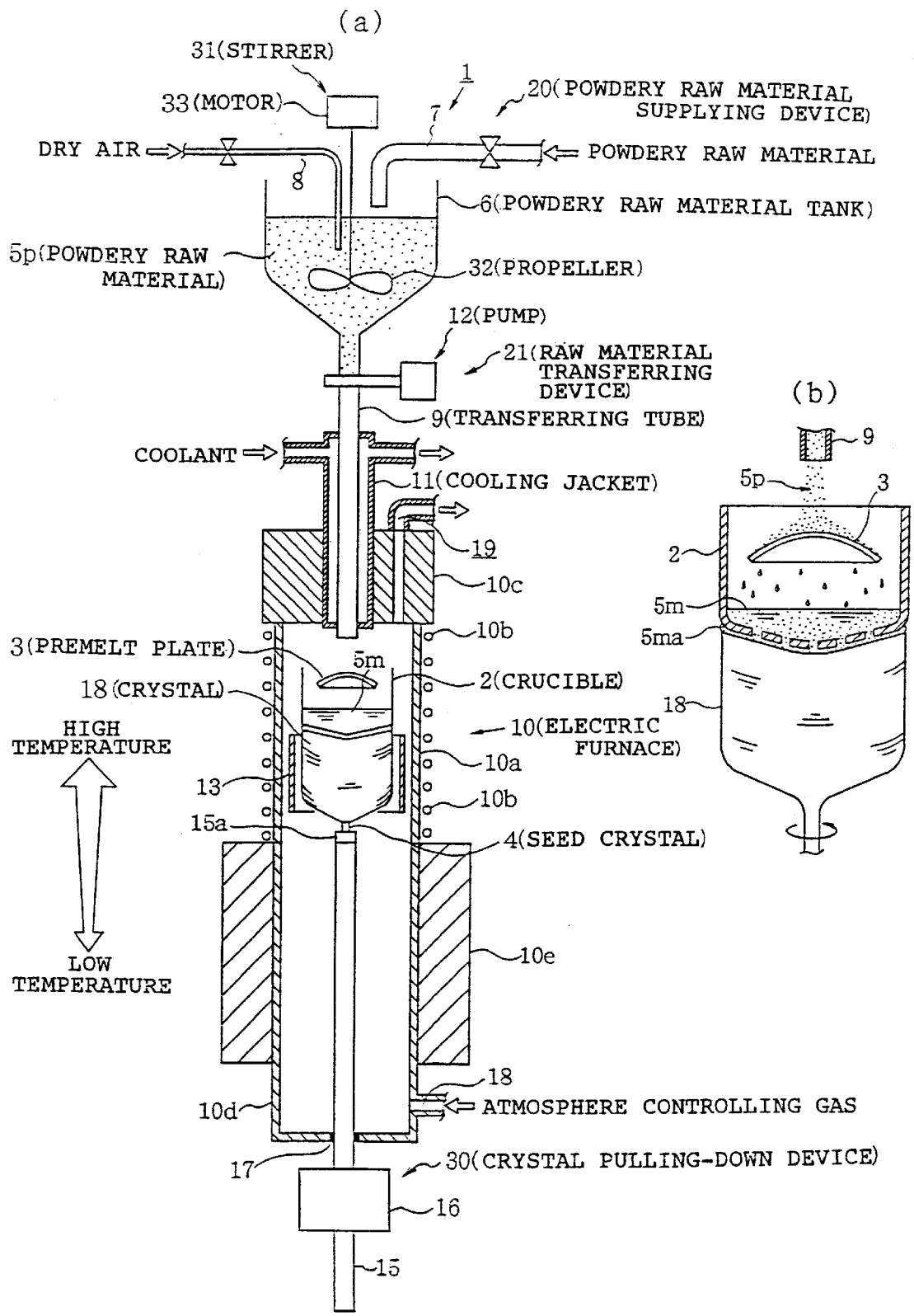
FIG. 1($a$) is a schematic view of the whole of an embodiment of a monocrystal producing device according to the present invention, and FIG. 1($b$) is a partially enlarged sectional view of the monocrystal producing device shown in FIG. 1($a$).

The present invention will be more specifically described by way of embodiments shown in the drawings.

[First Embodiment]

FIG. 1($a$) is a schematic view of the whole of an embodiment of a monocrystal producing device according to the present invention. Explanation on this embodiment is about a case of producing monocrystals of substances having a relatively high melting point (1300° C.–1900° C.), such as LT, rutile ($TiO_2$) and various optically active crystals.

In FIG. 1($a$), reference numbers 10, 20 and 30 represent an electric furnace, a powdery raw material supplying device, and a crystal pulling-down device, respectively.

In the electric furnace 10, a radio-frequency induction heating coil 10$b$ is arranged around a cylindrical quartz tube 10$a$. A platinum crucible 2 is set at the upper portion of the electric furnace 10, and an after-heater 13 is set at the lower portion thereof. An umbrella-shaped (or dome-shaped) premelt plate 3 is set inside the crucible 2 and near the upper opening thereof. The premelt plate 3 is made of a metal having good heat-resistance and corrosion-resistance, such as platinum or iridium, and is supported at a fixed position through non-illustrated supporters in the manner that several portions of the periphery thereof are connected to the crucible 2. Since all of the crucible 2, the premelt plate 3 and the after-heater 13 are made of metals, and thus they are heated by electromagnetic waves generated by the radio-frequency induction heating coil 10$b$.

The radio-frequency induction coil 10$b$ is separated into plural coil elements along the vertical direction. The upper coil elements cause the crucible 2 and the premelt plate 3 to be heated to a temperature (for example, 1900° C.) of not less than the melting point of $TiO_2$. The lower coil elements cause the after-heater 13 to be heated to a temperature (for example, 1800° C.) below the melting point of $TiO_2$. The after-heater 13 causes a monocrystal grown from the lower face of the crucible 2 to be heated in non-contact from the surrounding by radiating-heat so as to prevent the generation of crystal defects based on an abrupt drop in the temperature of the crystal. The after-heater 13 also has an annealing effect for removing the strain of the crystal.

The upper opening of the quartz tube 10$a$ constituting the electric furnace 10 is shut with a lid 10$c$ made of a heat insulator. The lower end of the quartz tube 10$a$ is connected to a cylindrical quartz container 10$d$ having a bottom. The whole of the electric furnace 10 is vertically supported through a heat insulating wall 10$e$ surrounding the quartz container 10$d$ by means of a non-illustrated supporter.

The powdery raw material supplying device 20 has a powdery raw material tank 6 for receiving a powdery raw material 5$p$, a raw material introducing tube 7 for introducing the powdery raw material 5$p$ from a non-illustrated powdery raw material supplying source to the powdery raw material tank 6, a dry gas introducing tube 8 for introducing a dry gas (dry air, nitrogen, argon, helium or the like) from a non-illustrated dry air generating source to the powdery raw material 5$p$ inside the powdery raw material tank 6, and a raw material transferring device 21 for transferring the powdery raw material 5$p$ from the powdery raw material tank 6 to a raw material melting tank 3. The powdery raw material supplying device 20 has a stirrer 31. By rotating a stirring propeller 32 arranged inside the powdery raw material tank 6 through a motor 33, the powdery raw material 5$p$ inside the powdery raw material tank 6 is forcibly stirred.

The raw material transferring device 21 has a transferring tube 9 whose upper end side is inserted into a bottom portion 6a of the raw material tank 6 and whose lower end side is inserted into the electric furnace 10 in order to transfer the powdery raw material 5p to the premelt plate 3, a cooling jacket 11 for cooling this transferring tube 9, and a powder supplying pump 12 fitted to the middle of the transferring tube 9 in order to transfer the powdery raw material 5p forcibly. The transferring tube 9 and the cooling jacket 11 are inserted into a penetration hole made at the central portion of the lid 10c of the electric furnace 10. The cooling jacket 11 is arranged to surround the circumference of the transferring tube 9, and causes the inside of the transferring tube 9 to be kept below the melting temperature of a raw material of a crystal against the heat from the electric furnace 10 by cooling the transferring tube 9 from the outside with a cooling medium passing inside it.

The crystal pulling-down device 30 comprises a columnar rotating rod 15 having, at its upper end portion, a supporting portion 15a for supporting a seed crystal 4, and a rotating pulling-down device 16 for rotating the rotating rod 15 axially with keeping the rod 15 vertical and simultaneously moving the rod 15 vertically. The rotating rod 15 penetrates the bottom of the quartz container 10d, and a sliding portion of the rotating rod 15 and the quartz container 10d is air-tightly sealed with a sealing member 17.

A control gas introducing opening 18 is provided in a side wall near the lower end of the quartz container 10d, this opening 18 being for introducing a gas (for example, a blend gas of $N_2$ and $O_2$ in an amount of 2–3 parts by weight of $N_2$, or Ar gas) for controlling a crystal growing atmosphere in a treating chamber made by the quartz tube 10a, the lid 10c and the quartz container 10d. The atmosphere control gas introduced into the treating chamber is discharged from an exhaust opening 19 made in the lid 10c, and recovered by means of a non-illustrated recovering device.

FIG. 1(b) shows a structure of the crucible 2 and the premelt plate 3. As illustrated in FIG. 1(b), the powdery raw material 5p introduced through the transferring tube 9 of the raw material transferring device 21 into the electric furnace 10 drops out onto the premelt plate 3. The premelt plate 3 is heated to not less than the melting point of the crystal raw material by electromagnetic waves generated by the induction heating coil 10b of the electric furnace 10. Therefore, the powdery raw material is melted on the premelt plate 3 to drop out as a raw material melt into a melt-collecting portion of the crucible 2. The bottom portion of the crucible 2 is made into a funnel form (a reverse cone form). Besides, plural fine holes 2a, 2a . . . having the same diameter (for example, 0.5 mm) are made at the center portion of the bottom portion and at the peripheral portion thereof. By causing the raw material melt 5m to flow out from the fine holes 2a, 2a . . . , the whole of the lower face of the crucible 2 is effectively used and the raw material melt 5ma is kept between this lower face and the upper face of a growing crystal 18 so as to grow the crystal.

Therefore, the crystal can be grown with keeping the flow amount of the raw material melt 5m from the fine holes 2a, 2a . . . in the bottom of the crucible 2 substantially constant by controlling the amount of the raw material 5p to be supplied onto the premelt plate 3 and continuously supplying the raw material melt 5m with keeping the flow amount of the raw material 5m to be dropped into the melt-collecting portion of the crucible 2 from above the premelt plate 3.

The thickness of the raw material melt 5ma present between the crucible 2 and the upper face (crystal interface) of the crystal 18 is decided to make up to an optimal thickness by controlling temperature inside the furnace, rotation speed and descending speed of the rotting rod 15, considering mainly the supplying amount of the raw material melt 5m from the premelt plate 3, the viscosity of the raw material melt 5m, the temperature of the crucible 2, crystal growing speed, the temperature of the crystal 18, and the like. In other words, considering a natural convection current of the raw material melt 5ma, that is, a convection current based on the difference between the temperature of the crucible 2 and that of the crystal 18, an optimal amount of the raw material melt 5ma can always be kept between the crucible 2 and the upper surface of the crystal 18 by generating a compulsory convection current resulting from centrifugal force based on the rotation of the rotating rod 15.

According to the monocrystal producing device 1 having the above-mentioned structure, a monocrystal can be produced as follows.

First, the heating temperature by the coil element at the upper side of the electric furnace 10 and that by the coil element at the lower side thereof are set to a given temperature not less than the melting temperature of a raw material of a crystal and a given temperature below the melting temperature of the raw material of the crystal, respectively, to start heating the inside of the furnace. When the temperature of the inside of the furnace becomes the set temperature, the state at that time is kept. A coolant is always caused to flow in the cooling jacket 11, and a dry gas is always caused to flow through the dry gas introducing tube 8 in the powdery raw material 5p inside the powdery raw material tank 6.

Subsequently, the powdery supplying pump 12 is operated to supply, at each time, a given amount of the powdery raw material 5p from the powdery raw material tank 6 to the central portion of the upper face of the premelt plate 3 through the transferring tube 9. At this time, the powdery raw material 5p is supplied through the transferring tube 9 while being stirred inside the powdery raw material tank 6 with the dry air introduced through the dry gas introducing tube 8 and the propeller 32 of the stirrer 31.

The powdery raw material 5p supplied onto the premelt plate 3 is heated to not less than the melting point and melted plate 3 to become the raw material melt 5m. The raw material melt 5m flows down along the upper face of the premelt plate 3, and subsequently drops down from the peripheral portion. Thus, the raw material melt 5m is introduced to the bottom portion of the crucible 2.

When the raw material melt 5m is collected in the crucible 2, the raw material melt 5m starts to leak out from the fine holes 2a, 2a . . . of the bottom portion of the crucible 2. This situation can be observed through the quartz tube 10a of the electric furnace 1; therefore, if the leakage-out of the raw material melt 5m is recognized, the rotating rod 15 is raised with the rotating pulling-down device 16 to bring the tip (upper end) of the seed crystal 4 supported by the rotating rod 15 into contact with the raw material melt 5m wetting the lower face of the crucible 2.

Thereafter, the rotating rod 15 is descended with the rotation thereof in a constant direction by means of the rotating pulling-down device 16 while the state that the tip of the seed crystal 4 contacts the raw material melt 5m is kept. In this way, the crystal 18 is being grown from the tip of the seed crystal 4.

At that time, the shoulder portion of the monocrystal rod 15 is first grown by controlling the amount of the powdery raw material 5p supplied onto the premelt plate 3 to control the amount of the raw material 5m supplied into the melt-collecting portion of the crucible 2 and simultaneously controlling the descending speed of the rotating rod 15. After the shoulder portion comes to have a desired diameter, the descending speed of the rotating rod 15 is controlled to keep the diameter and simultaneously the body portion, which has high availability, is grown over a sufficient time. When the body portion is grown into an optimal size, the powder supplying pump 12 is stopped.

At the time of the above-mentioned growth of the crystal, the amount of the raw material melt $5m$ inside the crucible 2 is kept substantially constant from the starting time of the growth of the body portion to the finishing time thereof, so as to grow the crystal while keeping the outflow amount of the raw material melt $5m$ from the fine holes $2a, 2a \ldots$ of the bottom portion of the crucible 2.

By keeping the outflow amount of the raw material melt $5m$ from the fine holes $2a, 2a \ldots$ of the bottom portion of the crucible 2 substantially constant in the above-mentioned way, the amount of the raw material melt $5m$ supplied onto the upper face of the growing crystal 18 per unit time can be kept substantially constant during the growth of the crystal.

Therefore, the monocrystal producing device 1 of the present embodiment has the following advantageous effects.

Namely, the amount of the raw material melt $5m$ supplied onto the upper face of the growing crystal 18 per unit time can be kept substantially constant during the growth of the crystal; therefore, the body portion, which has high availability, can be produced to have a large diameter and a long size by growing the crystal while continuously supplying the powdery raw material $5p$ from the powder raw material tank 6 to the premelt plate 3.

The diameter of the grown crystal can be made larger by appropriately setting the viscosity of the raw material melt or wettability thereof to the crucible 2, the number, the position, the size of the fine holes $2a, 2a \ldots$ of the bottom portion of the crucible 2, the bottom shape of the crucible 2, or the like.

Not only the $TiO_2$ powder but also other powders can be freely selected as the powdery raw material $5p$ to be put into the powdery raw material tank 6. Therefore, costs for raw materials can be made lower than the vertical Bridgman method using an amorphous sintered body as a raw material. It is profitable for a reduction in costs for the production to use the seed in a rod form in the same manner as in the Czochralski method.

Since the process for growing the crystal from the powdery raw material $5p$ is continues, a monocrystal having a stable composition can be obtained. Therefore, a crystal, such as LN, LT or LGS, having a desired composition can be grown.

When raw materials whose composition is easily changed upon melting thereof are used, homogenous crystals whose compositions are not changed can be grown by considering the change in the compositions upon melting beforehand and adjusting the ratio of the components of the raw material powder $5p$.

High-priced constituting elements such as the platinum crucible 2 can be used semipermanently after only initial investment. Thus, costs for the production can be made low.

Since the moisture of the raw material powder $5p$ is removed by introducing dry air into the powdery raw material $5p$ inside the powdery raw material tank 6, it is possible to prevent condensation of the raw material powder $5p$ by the moisture and supply the powdery raw material $5p$ having a constant ratio of the components stably onto the premelt plate 3.

The transferring tube 9 is cooled which transfers the powdery raw material $5p$ from the outside of the electric furnace 10 onto the premelt plate 3 inside the electric furnace 10; therefore, melting of the powdery raw material $5p$ is prevented inside the transferring tube 9 to prevent the filling in the transferring tube 9. Thus, the powdery raw material $5p$ can be stably supplied onto the premelt plate 3.

The crystal growing treatment can be performed in a stable atmosphere by filling Ar gas or the like into the electric furnace 10; therefore, a crystal having a stable chemical composition can be grown.

A crystal having a good quality can be automatically grown by computer-controlling the above-mentioned electric furnace 10, the powder raw material supplying device 20, the raw material transferring device 21, the crystal pulling-down device. 30, and the like.

As the above-mentioned embodiment, there is described an example of a device structure suitable for producing a monocrystal having a high-melting point, such as $TiO_2$. However, in the case that a raw material has a low melting point, a monocrystal can be grown and produced even by using an electric furnace of a resistance-heating type instead of the electric furnace of the radio-frequency heating type.

As the structure example of the premelt plate 3 in the above description, the case having an umbrella shape, that is, the case having an upward convex structure is described. It is not limited to this example. As shown in, e.g., FIG. 2, a dish form, that is, the example having a downward convex structure is allowable. In this case, as the powdery raw material $5p$ is supplied onto the premelt plate 3' through the transferring tube 9 of the raw material transferring device 21, the premelt plate 3 is filled with the raw material melt $5m$. As a result, the raw material melt $5m$ that has dropped out from the premelt plate 3 drops down into the melt-collecting portion of the crucible 2.

Figure 3:
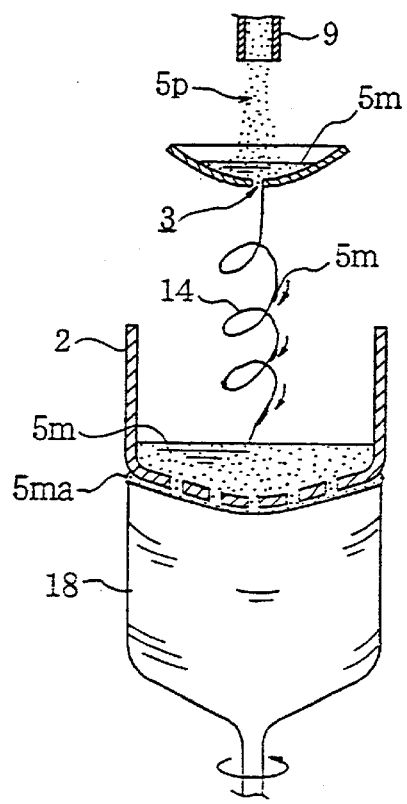
FIG. 3 is a sectional view of a main portion of a further embodiment of a monocrystal producing device according to the present invention.

As shown in FIG. 3, a hole $3a$ is made in the bottom portion of the premelt plate 3" made up into a dish form and the raw material melt $5m$ that leaks out from this hole $3a$ and drops down may be transferred along the surface of a guide member such as a platinum wire 14 and guided to the crucible 2. In this way, water or impurities remaining in the raw material melt $5m$ upon the generation thereof are, when transferred on the platinum wire 14, evaporated and removed from the raw material melt $5m$ by the heat from the electric furnace. Accordingly, it is possible to grow a crystal of a high quality, which contains no foam or impurities.

Figure 2:
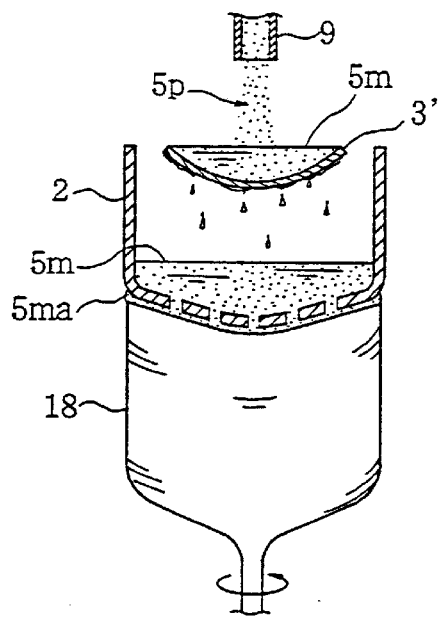
FIG. 2 is a sectional view of a main portion of another embodiment of a monocrystal producing device according to the present invention.

The structures of the premelt plate shown in FIGS. 1–3 are mere examples. Various other structures may be used. In short, it is allowable to select an optimal structure appropriately, considering the wettability of the raw material melt to the metal material of the premelt, the viscosity of the raw material melt, and the like.

Figure 4:
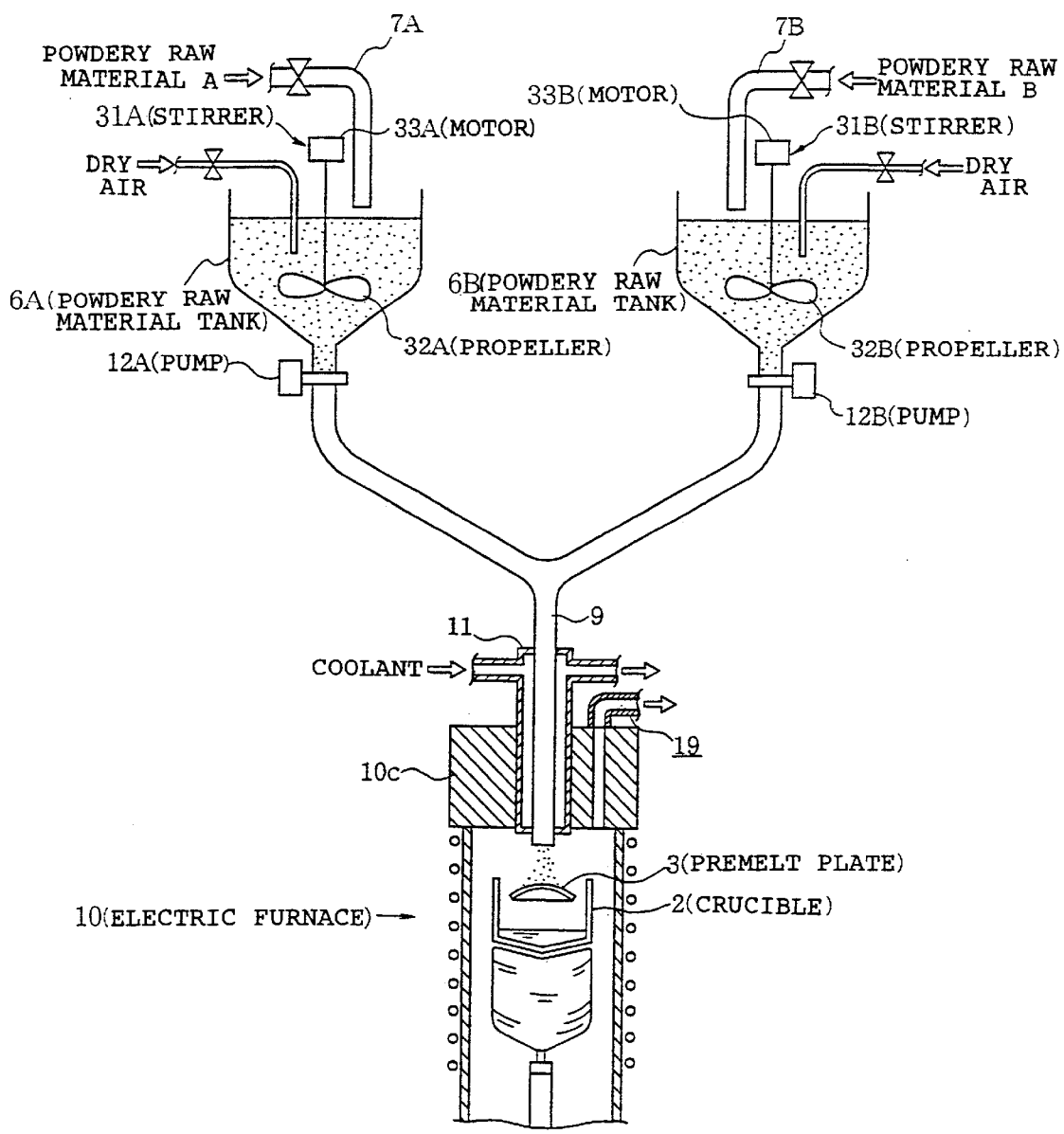
FIG. 4 is a sectional view of a main portion of a still further embodiment of a monocrystal producing device according to the present invention.

As shown in FIG. 4, the upper end portion of the powdery raw material transferring tube 9 may be branched to two tubes so as to connect powdery raw material tanks 6A and 6B to the respective branched tubes, arrange raw material introducing tubes 7A and 7B, dry air introducing tubes 8A and 8B, powder supplying pump 12A and 12B, stirrers 31A and 31B, and the like. Thus, two kinds of powdery raw materials A and B may be supplied onto a premelt plate 3 while being mixed inside the powdery raw material transferring tubes 9. In this way, for example, the powdery raw material A, as the main raw material, can be supplied onto the premelt plate 3 while the powdery raw material B as an additive is intermittently or continuously added to the raw material A. Thus, a monocrystal having any composition can be grown while the ratio of its components is adjusted.

Vapor pressures of respective raw material components of plural element based monocrystals such as LN and LBO are different upon melting of the raw materials. Therefore, if the raw material melt is allowed to stand for a long time, the composition thereof is changed. In many case, therefore, the composition of the grown crystal is changed or an homogeneous crystal cannot be grown by a change in the viscosity of the raw material melt. However, if the structure shown in FIG. 4 is used, it is possible to adjust delicately the amount of the additive in relative to the main raw material in the accordance with the change in the composition of the raw materials upon melting thereof. Thus, a homogeneous crystal can be grown without any change in its composition. For example, about $Bi_{12}GeO_{20}$ (BGO), $Bi_{12}SiO_{20}$ (BSO) or the like, a part of its composition is easily volatilized upon melting of raw materials thereof, and a wide solid solution region is near its congruent melt composition. Therefore, it is said that a constant composition cannot easily be obtained by the conventional CZ method. According to the present invention, however, it becomes possible to obtain a crystal having a constant composition.

Conversely, by using the device shown in FIG. 4, it is also possible to grow a crystal having a composition gradient or a crystal wherein regions having different compositions are stacked.

[Second Embodiment]

Figure 5:
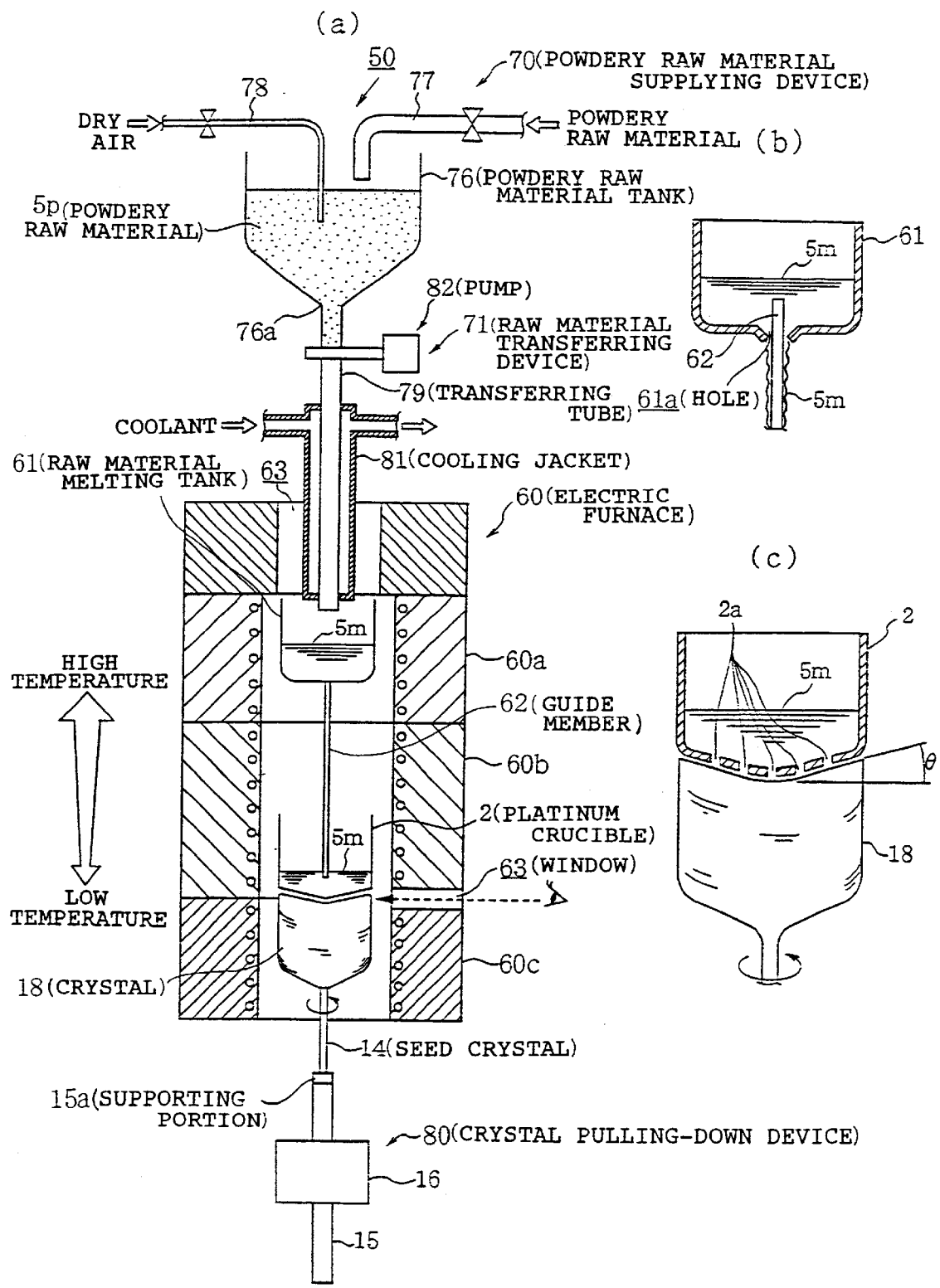
FIG. 5($a$) is a schematic view of the whole of an additional embodiment of a monocrystal producing device according to the present invention, and FIGS. 5($b$) and ($c$) are partially enlarged sectional views of the monocrystal producing device shown in FIG. 5($a$).
Figure 6:
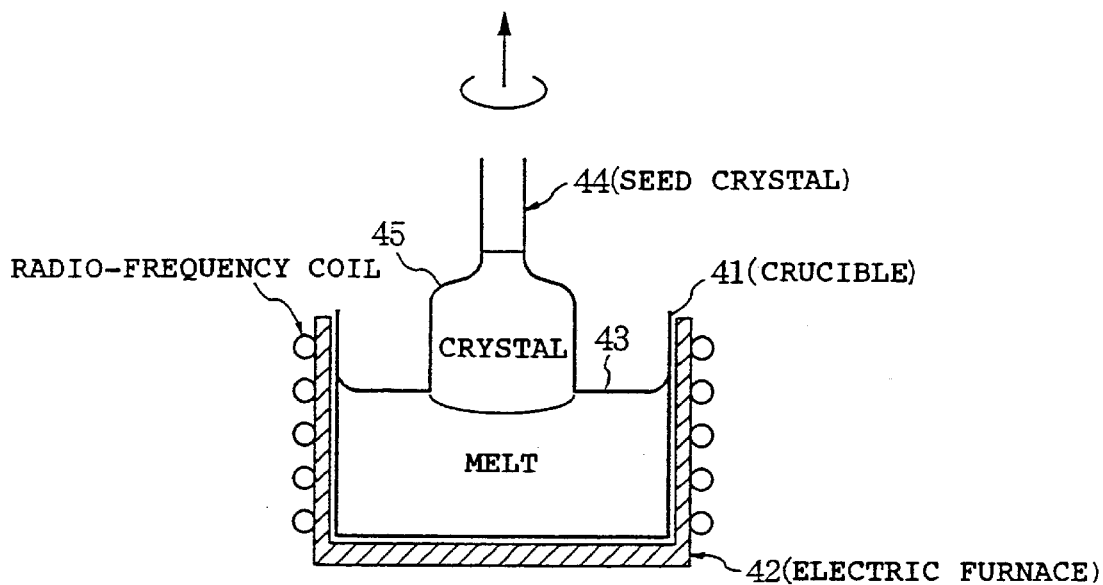
FIG. 6 is a view for explaining an example of conventional monocrystal producing devices.
Figure 7:
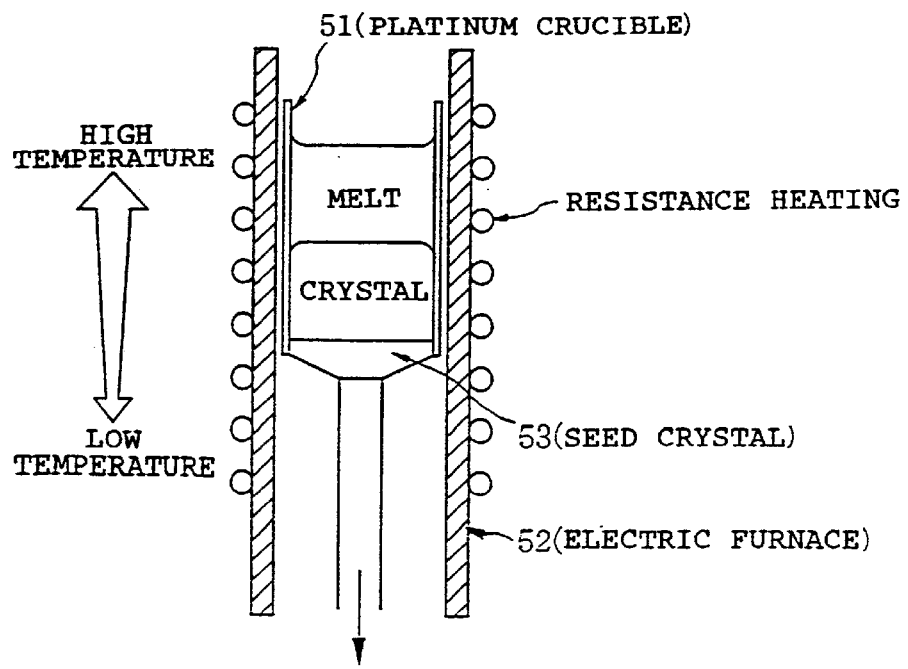
FIG. 7 is a view for explaining an example of conventional monocrystal producing devices.
Figure 8:
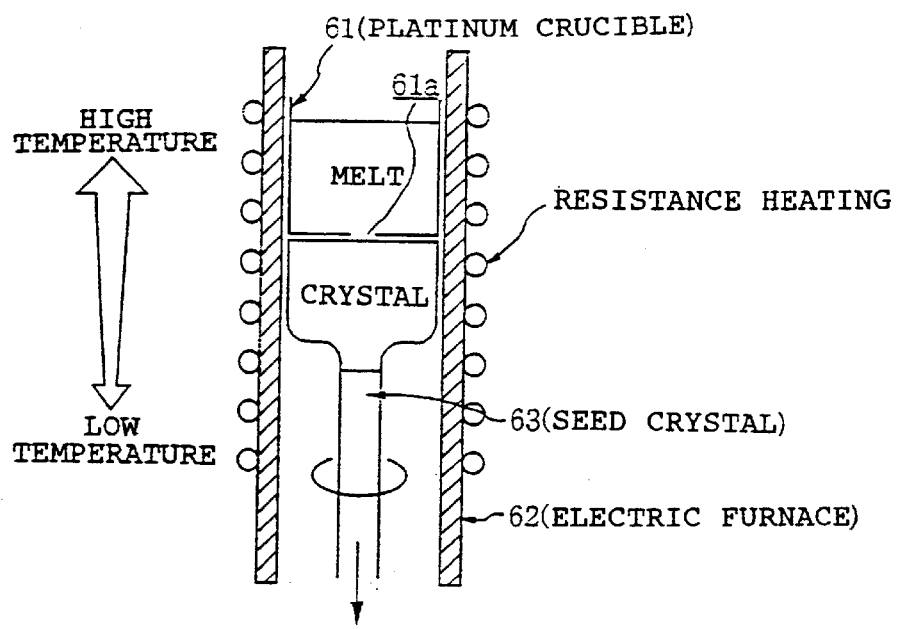
FIG. 8 is a view for explaining an example of conventional monocrystal producing devices.
Figure 9:
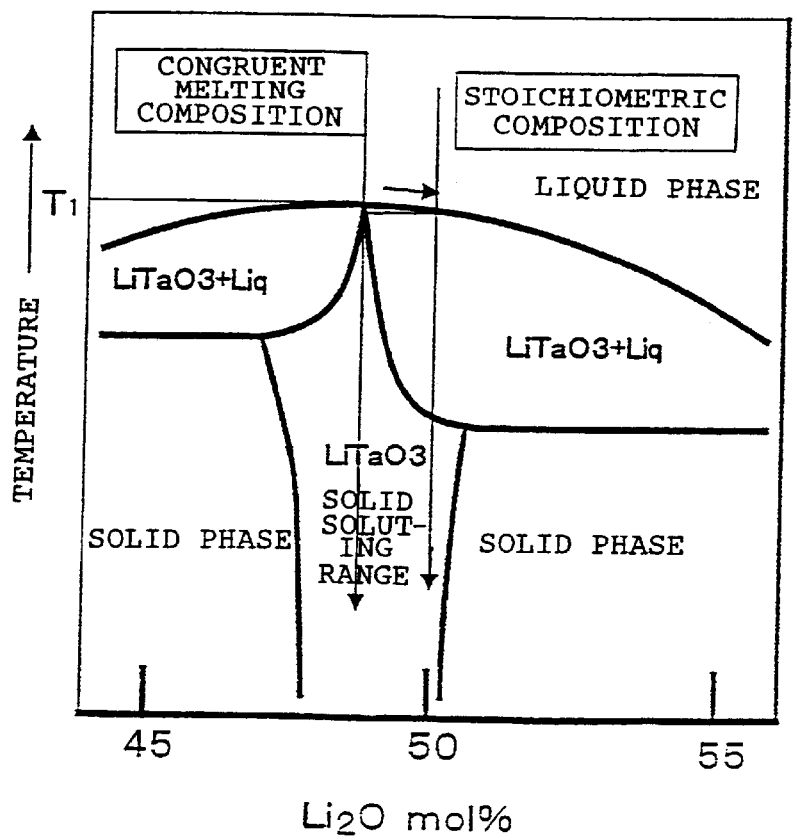
FIG. 9 is a phase diagram of lithium tantalate.

FIG. 5(*a*) is a schematic view of the whole of an additional embodiment of a monocrystal producing device according to the present invention. Explanation on this example is about a case of producing an LBO crystal.

In FIG. 5(*a*), reference numbers 60, 70 and 80 represent an electric furnace, a powdery raw material supplying device and a crystal pulling-down device, respectively.

The electric furnace 60 has a structure wherein three electric furnace elements 60*a*, 60*b* and 60*c* are vertically stacked and connected. A platinum crucible 2 is set at the lower portion of the electric furnace 60 and a raw material melting tank (referred to as a premelt crucible hereinafter) 61 made of platinum is set at the upper portion thereof. A platinum rod 62 is arranged between the premelt crucible 61 and the platinum crucible 2. The platinum rod 62 is a guide member for introducing a raw material melt 5*m* of LBO produced in the premelt crucible 61 into the platinum crucible 2.

The electric furnace 60*a* at the topmost portion of the electric furnace 60 causes the premelt crucible 61 to be heated to a temperature (for example, 995° C.) not less than the melting point of LBO. The electric furnace 60*b* at the middle portion thereof causes the platinum crucible 2 to be heated to a temperature (for example, 970° C.) not less than the melting point of LBO. The electric furnace 60*c* at the lowest portion thereof is set to a temperature (for example, 690° C.) below the melting point of LBO. This permits a gentle temperature gradient to be generated from the middle portion to the lowest portion to exhibit an annealing effect for removing strain of the grown crystal. A looking window 63 is disposed at the side wall of the electric furnace 60 to observe the vicinity of the lower portion of the platinum crucible 2, that is, the crystal growing portion out of the furnace with naked eyes. This looking window 63 is airtightly closed with heat-resistant glass.

A powdery raw material supplying device 70 has a powdery raw material tank 76 for receiving a powdery raw material 5*p* of LBO, a raw material introducing tube 77 for introducing the powdery raw material 5*p* from a non-illustrated powdery raw material supplying source to the powdery raw material tank 6, a dry gas introducing tube 78 for introducing a dry gas (dry air, nitrogen, argon, helium or the like) from a non-illustrated dry gas generating source to the powdery raw material 5*p* inside the powdery raw material tank 6, and a raw material transferring device 71 for transferring the powdery raw material 5*p* from the powdery raw material tank 76 to a raw material melting tank 61.

A raw material transferring device 71 has a transferring tube 79 whose upper end side is connected to a bottom portion 76*a* of the powdery raw material tank 76 and whose lower end side is inserted into the electric furnace 60 to transfer the powdery raw material 5*p* to the raw material melting tank 61, a cooling jacket 81 for cooling this transferring tube 79, and a powder supplying pump 82 fitted to the middle of the transferring tube 79 to transfer the powdery raw material 5*p* forcibly. The transferring tube 79 and the cooling jacket 81 are inserted into a penetration hole 63 made at the central portion of the lid 60*d* of the electric furnace 60. The lower end of the transferring tube 79 reaches the inside of the raw material melting tank 61. The cooling jacket 81 is arranged to surround the circumference of the transferring tube 79, and causes the inside of the transferring tube 79 to be kept below the melting temperature of LBO against the heat from the electric furnace 60 by cooling the transferring tube 79 from the outside with a cooling medium passing inside it.

The crystal pulling-down device 80 comprises a columnar rotating rod 15 having, at its upper end portion, a supporting portion 15*a* for supporting a seed crystal 14, and a rotating pulling-down device 16 for rotating the rotating rod 15 axially with keeping the rod 15 vertical and simultaneously moving the rod 15 vertically.

FIG. 5(*b*) shows a partial structure of the premelt crucible 61 and the platinum rod 62, and FIG. 5(*c*) shows a structure of the platinum crucible 2.

As shown in FIG. 5(*b*), a hole 61*a* is made at the center of the bottom portion of the premelt crucible 61, and the upper end portion of the platinum crucible 62 is inserted into this hole 61*a*. The diameter of the hole 61*a* is set to somewhat larger than the diameter of the platinum rod 62. The raw material melt 5*m* that has leaked out from the hole 61*a* drops out along the surface of the platinum rod 62 so as to be spontaneously guided into the platinum crucible 2.

As shown in FIG. 5(*c*), the bottom of the platinum crucible 2 is made into a funnel shape (a reverse cone shape). Besides, plural fine holes 2*a*, 2*a* . . . having the same diameter (for example, 0.5 mm) are made at the center portion of the bottom portion and at the peripheral portion thereof. By causing the raw material melt 5*m* to flow out from the fine holes 2*a*, 2*a* . . . , the whole of the lower face of the crucible 2 is effectively used and the raw material melt 5*m* is kept between the lower face and the upper face of a growing crystal 18 so as to grow the crystal.

According to the monocrystal producing device 50 having the above-mentioned structure, a LBO monocrystal can be produced as follows.

First, the temperature of the electric furnace elements 60*a* and 60*b* of the electric furnace 60 and that of the electric furnace member 60*c* thereof are set to a temperature not less than the melting temperature of LBO and a temperature below LBO, respectively, to start heating the inside of the furnace. If the temperature of the inside of the furnace becomes the set temperature, the state at this time is kept. A coolant is always caused to flow in the cooling jacket 81, and a dry gas is always caused to flow through the dry gas introducing tube 78 in the powdery raw material 5*p* inside the powdery raw material tank 76.

Subsequently, the powdery supplying pump 12 is operated to supply a given amount of the powdery raw material 5*p* from the powdery raw material tank 76 into the premelt crucible 61 through the transferring tube 79. The powdery raw material 5p supplied onto the premelt crucible 61 is heated with the electric furnace 60 and melted to become the raw material melt 5m. The raw material melt 5m flows down from the hole 61a of the bottom portion of the premelt crucible 61. This raw material melt 5m leaks out along the surface of the platinum rod 62, so that the raw material melt 5m is introduced into the platinum crucible 2.

When the raw material melt 5m is collected into the platinum crucible 2, the raw material melt 5m starts to leak out from the fine holes 2a, 2a . . . of the bottom portion of the platinum crucible 2. This situation can be observed through the looking window 63 of the electric furnace 60; therefore, if the leakage-out of the raw material melt 5m is recognized, the rotating rod 15 is raised with the rotating pulling-down device 16 to bring the tip (upper end) of the seed crystal 14 supported by the rotating rod 15 into contact with the raw material melt 5m wetting the lower face of the platinum crucible 2.

Thereafter, the rotating rod 15 is descended at a constant speed (for example, 0.75 mm/h) while being rotated in a constant direction and at a constant speed (for example, 30 rpm) with the rotating pulling-down device 16. In this way, the crystal 18 is being grown from the tip of the seed crystal 14.

At the time, by controlling the amount of the powdery raw material 5p supplied into the premelt crucible 61 to control the amount of the raw material 5m introduced into the platinum crucible 2, the amount of the raw material melt 5m inside the crucible 2 is substantially kept from the starting time of the growth of the crystal to the finishing time thereof, so as to grow the crystal 18 while keeping the outflow amount of the raw material melt 5m from the fine holes 2a, 2a . . . of the bottom portion of the crucible 2 substantially constant.

By keeping the outflow amount of the raw material melt 5m from the fine holes 2a, 2a . . . of the bottom portion of the crucible 2 substantially constant in the above-mentioned way, the amount of the raw material melt 5m supplied onto the upper face of the growing crystal 18 per unit time can be kept substantially constant during the growth of the crystal.

Therefore, the monocrystal producing device 1 of the present embodiment has the following advantageous effects.

Namely, the amount of the raw material melt 5m supplied onto the upper face of the growing crystal 18 per unit time can be kept substantially constant during the growth of the crystal; therefore, an LBO monocrystal having a great amount of a body portion and a long size can be obtained by growing the crystal while continuously supplying the powdery raw material 5p into the premelt crucible 61 from the powder raw material tank 6.

The powder of LBO, the blend powder of $Li_2O$ and $B_2O_3$, and the like can be freely selected as the powdery raw material 5p put into the powdery raw material tank 76. Accordingly, costs for raw materials can be made lower than the vertical Bridgman method using an amorphous LBO sintered body as a raw material. It is profitable for a reduction in costs for the production to use the seed in a rod form in the same manner as in the Czochralski method.

Vapor pressures of respective raw material components of plural element based monocrystals such as LBO are different upon melting of the raw materials to change the composition of the raw material melt. In many case, therefore, the composition of the grown crystal is changed or an homogeneous crystal cannot be grown by a change in the viscosity of the raw material melt. However, according to the monocrystal producing device 50 of the present embodiment, homogenous crystals whose compositions are not changed can be grown by considering the change in the compositions upon melting of raw materials beforehand and adjusting the ratio of the components of the raw material powder 5p.

Since the moisture of the raw material powder 5p is removed by introducing dry air into the powdery raw material 5p inside the powdery raw material tank 76, it is possible to prevent condensation of the raw material powder 5p by the moisture and supply the powdery raw material 5p having a constant ratio of the components stably into the premelt crucible 61.

The transferring tube 79 is cooled which transfers the powdery raw material 5p from the outside of the electric furnace 60 into the premelt crucible 61 inside the electric furnace 60; therefore, melting of the powdery raw material 5p is prevented inside the transferring tube 79 to prevent the filling in the transferring tube 79. Thus, the powdery raw material 5p can be stably supplied into the premelt crucible 61.

The raw material melt 5m that leaks out from the hole 61a made in the bottom portion of the premelt crucible 61 and flows down is transferred along the surface of the platinum rod 62 to be guided into the platinum crucible 2. In this way, water or impurities remaining in the raw material melt 5m generated in the premelt crucible 61 can be removed by the heat from the electric furnace before they are put into the platinum crucible 2. Accordingly, it is possible to grow a crystal of a high quality, which contains no foam or impurities.

Since the looking window 63 is disposed in the side wall of the electric furnace 60 so that the crystal growing portion can be observed in situ, the portion of sowing a seed and the shoulder portion can easily be controlled.

The diameter of the grown crystal can be made large by appropriately setting the number, the position, the size of the fine holes 2a, 2a . . . of the bottom portion of the crucible 2, the bottom shape and the taper angle $\theta$ (see FIG. 5(c)) and the like.

An LBO monocrystal having a good quality can be automatically grown by computer-controlling the electric furnace 60, the powdery raw material supplying device 70, the raw material transferring device 71, the crystal pulling-down device 80 and the like.

As the above-mentioned embodiment, the case of producing a monocrystal of LBO is described as an example. The monocrystal producing device 1 having the above-mentioned structure can be however applied to the production of monocrystals such as rutile used as a raw material of an optical isolator, BGO or BSO used as a raw material of a scintillator, CLBO, which is one kind of nonlinear optical materials, and LN or LT known as a piezoelectric/optical material.

EXAMPLES

Example 1

According to the methods described as the first and second embodiments, lithium niobate ($LiNbO_3$) monocrystals were grown.

As the powdery raw material 5p, a powdery raw material of mixed lithium (Li) powder and niobium (Nb) powder was used. The component ratio of lithium to the total of lithium and the niobium was set to 48.5–50.0% in the powdery raw material 5p.

As a result, both of the embodiments made it possible to grow lithium niobate monocrystals having an incongruent melt composition and a diameter of not less than 1.2 inches, specifically monocrystals having a body portion of 2 inches in diameter and of 100 mm in length. The component ratio of lithium to the total of lithium and the niobium was set to 48.5–50.0% in the resultant crystals 18. Measurement of the Curie points in various portions demonstrated that the scattering therein was ±2° C. Thus, it was proved that the crystals 18 were homogenous.

Example 2

According to the methods described as the first and second embodiments, lithium tantalate ($LiTaO_3$) monocrystals were grown.

As the powdery raw material 5p, a powdery raw material of mixed lithium (Li) powder and tantalum (Ta) powder was used. The component ratio of lithium to the total of lithium and the tantalate was set to 48.5–50.0% in the powdery raw materials 5p.

As a result, both of the embodiments made it possible to grow lithium tantalate monocrystals having an incongruent melt composition and a diameter of not less than 1.2 inches, specifically monocrystals having a body portion of 2 inches in diameter and of 100 mm in length. The component ratio of lithium to the total of lithium and the tantalate was set to 48.5–50.0% in the resultant crystals 18. Measurement of the Curie points in various portions demonstrated that the scattering therein was +2° C. Thus, it was proved that the crystals 18 were homogenous.

In the above-mentioned two Examples, the limitations of the diameter of the body portion and the length thereof were 2 inches and 100 mm, respectively, in the light of the structure of the producing device manufactured by way of trial. This experiment demonstrated that use of a larger producing device makes it possible to obtain a crystal having a body portion of not less than 2 inches in diameter and of not less than 100 mm in length.

The present invention can be applied to the growth of not only LN, LT and LBO but also other monocrystals.

For example, the present invention can also be applied to compound semiconductor such as GaAs and InP, and would be effective for growing a crystal having a desired composition and a large diameter.

Concerning a crystal which does not have any congruent melt composition, i.e., a so-called incongruent melting compound, the following phenomena arise: on the basis of its nature a crystal having a composition different from a target composition is generated at the initial stage of the crystallization even if the composition of melted raw materials becomes a desired composition according to the conventional CZ method or the VB method, and further a crystal having a desired composition is generated with the advance of the crystal growth. Hitherto, therefore, it has been inevitable to rely on inefficient methods whose growing speed is slow to obtain a crystal having only a small diameter, such as the flux method. If the present invention is used, however, a crystal having a desired composition and a large diameter can be effectively grown even about the decomposition melt type crystal such as $Bi_{12}TiO_{20}$ (BTO) and $KNbO_3$.

As described above, the present invention has excellent advantages as follows.

According to the invention of claim 1, in the monocrystal producing device using the pulling-down method the powdery raw material is supplied onto the premelt plate and then the powdery raw material is melted on the premelt plate to generate the raw material melt to introduce the raw material melt into a melt-collecting portion of the crucible. In this way, a crystal can be grown while the raw material melt is continuously supplied into the crucible. It is therefore possible to obtain easily a monocrystal having a large diameter and a long size. The process for growing the crystal from the powdery raw material can be continuously performed so that the composition of the obtained monocrystal becomes stable. High-priced constituting elements such as the platinum crucible can be used semipermanently after only initial investment. Thus, producing costs can be made low.

According to the invention of claim 2, by introducing the dry air into the powdery raw material to remove the moisture of the raw material powder, it is possible to prevent condensation of the raw material powder by the moisture and supply stably the powdery raw material having a constant ratio of the components. Therefore, a crystal having a more stable composition and a high quality can be grown.

According to the invention of claim 3, the structure of the device can be made simple since the crucible and the premelt plate can be heated with the single electric furnace. It is possible to prevent the generation of filling based on melting of the powdery raw material in the transferring tube since the transferring tube for transferring the powdery raw material from the outside of the electric furnace onto the premelt plate inside the electric furnace. Thus, the powdery raw material can be stably supplied onto the premelt plate.

According to the invention of claim 4, in the monocrystal producing device using the pulling-down method the powdery raw material is supplied to the raw material melting tank with the powdery raw material supplying means and the raw material is melted in the raw material melting tank to generate the raw material melt. This raw material melt is introduced into the crucible with the raw material melt introducing means. In this way, the crystal can be grown while the raw material melt is continuously supplied into the crucible. Accordingly, a crystal of a substance whose melt has a large viscosity, such as LBO, can be produced at a low price to have a good quality.

According to the invention of claim 5, the dry air is introduced into the powdery raw material to remove the moisture of the raw material powder. Thus, it is possible to prevent condensation of the raw material based on the moisture and supply the powdery raw material having a constant composition ratio stably.

According to the invention of claim 6, the structure of the device can be made simple since the crucible and the raw material melting tank can be heated with the single electric furnace. It is possible to prevent the generation of filling based on melting of the powdery raw material in the transferring tube since the transferring tube for transferring the powdery raw material from the outside of the electric furnace to the raw material melting tank inside the electric furnace. Thus, the generation of the filling by melting of the powdery raw material in the transferring tube is prevented. Thus, the powdery raw material can be stably supplied onto the raw material melting tank.

According to the invention of claim 7, the raw material melt that has leaked out from the hole made at the bottom portion of the raw material melting tank and dropped out may be transferred along the surface of the guide member and guided into the crucible. In this way, water or impurities remaining in the raw material melt generated in the raw material melting tank are, before being put into the crucible, evaporated and removed by the heat from the electric furnace. Accordingly, it is possible to grow a crystal of a high quality, which contains no foam or impurities.

According to the invention of claim 8, in the monocrystal producing device using the pulling-down method the premelt plate is disposed inside or above the crucible inside the electric furnace, and the powdery raw material is supplied in an appropriate amount at each time from the powdery raw material tank out of the electric furnace onto the premelt plate through the transferring tube. Thus, the powdery raw material is melted on the premelt plate. Subsequently, it is introduced in the melt collecting portion of the crucible. In this way, a crystal can be grown while the raw material melt is continuously supplied in the crucible to keep the outflow amount of the raw material melt from the fine hole of the bottom portion of the crucible substantially constant. Therefore, a monocrystal having a large diameter and a long size can easily be obtained. Moreover, the obtained crystal has a stable composition since the process for growing the crystal from the powdery raw material is continuously performed.

According to the invention of claim 9, in the monocrystal producing device using the pulling-down method the raw material melting tank is disposed above the crucible inside the electric furnace, and the powdery raw material is supplied in an appropriate amount at each time from the powdery raw material tank out of the electric furnace onto the raw material melting tank through the transferring tube. Thus, the powdery raw material is melted in the raw material melting tank. Subsequently, it is introduced in the melt collecting portion of the crucible. In this way, a crystal can be grown while the raw material melt is continuously supplied in the crucible to keep the outflow amount of the raw material melt from the fine hole of the bottom portion of the crucible substantially constant. Therefore, a monocrystal having a large diameter and a long size can easily be obtained. Moreover, the obtained crystal has a stable composition, since the process for growing the crystal from the powdery raw material is continuously performed.

According to the invention of claim 10, it is possible to produce a lithium niobate monocrystal of an incongruent melt composition in which the component ratio of lithium to the total of lithium and niobium is from 48.5 to 50.0% and its diameter is 1.2 inches or more.

According to the invention of claim 11, it is possible to produce a lithium tantalate monocrystal of an incongruent melt composition in which the component ratio of lithium to the total of lithium and tantalum is from 48.5 to 50.0% and its diameter is 1.2 inches or more.

According to the monocrystals of the inventions of claims 12–16, it is possible to improve properties and productivity of piezoelectric materials and optical materials such as an SAW device.

What is claimed is:

1. A monocrystal producing process for growing a crystal comprising arranging a funnel shaped crucible for melting a raw material in an electric furnace, keeping the crucible at a temperature not less than the melting point of the raw material, and pulling down and simultaneously rotating a seed crystal in the state that the upper end portion of the seed crystal is brought into contact with a raw material melt that has leaked out from a fine hole made at the bottom portion of the crucible, said process further characterized by performing the crystal growth while supplying the raw material melt continuously into the crucible to keep the outflow amount of the raw material melt from the fine hole at the bottom portion of the crucible substantially constant by arranging a premelt plate inside or above the crucible inside the electric furnace, supplying the powdery raw material in an appropriate amount at each time from the powdery raw material tank out of the electric furnace onto the premelt plate through a transferring tube so as to melt the powdery raw material on the premelt plate, and introducing the melt into a melt-collecting portion of the crucible.

2. A monocrystal producing process for growing a crystal comprising arranging a funnel shaped crucible for melting a raw material in an electric furnace, keeping the crucible at a temperature not less than the melting point of the raw material, and pulling down and simultaneously rotating a seed crystal in the state that the upper end portion of the seed crystal is brought into contact with a raw material melt that has leaked out from a fine hole made at the bottom portion of the crucible, said process further characterized by performing the crystal growth while supplying the raw material melt continuously into the crucible to keep the outflow amount of the raw material melt from the hole at the bottom portion of the crucible substantially constant by arranging a raw material melting tank above the crucible inside the electric furnace, supplying the powdery raw material in an appropriate amount at each time from the powdery raw material tank out of the electric furnace into the raw material melting tank through a transferring tube so as to melt the powdery raw material in the raw material melting tank, and subsequently introducing the melt into a melt-collecting portion of the crucible.

3. The monocrystal producing process according to claim 1 or 2, characterized in that the powdery raw material is a powdery raw material comprising a mixture of lithium (Li) powder and niobium (Nb) powder, and the component ratio of lithium to the total of lithium and niobium in the powdery raw material is from 48.5 to 50.0%.

4. A monocrystal producing process according to claim 1 or 2, characterized in that the powdery raw material is a powdery raw material comprising a mixture of lithium (Li) powder and tantalum (Ta) powder, and the component ratio of lithium to the total of lithium and tantalum in the powdery raw material is from 48.5 to 50.0%.

* * * * *